United States Patent
Ausschnitt et al.

(10) Patent No.: US 6,429,667 B1
(45) Date of Patent: Aug. 6, 2002

(54) ELECTRICALLY TESTABLE PROCESS WINDOW MONITOR FOR LITHOGRAPHIC PROCESSING

(75) Inventors: Christopher P. Ausschnitt, Brookfield, CT (US); Christopher E. Obszarny, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 09/597,921

(22) Filed: Jun. 19, 2000

(51) Int. Cl.$^7$ .............................................. G01R 27/08
(52) U.S. Cl. ...................... 324/699; 324/716; 324/719
(58) Field of Search ................................ 324/699, 716, 324/719, 73.1, 158.1, 765

(56) References Cited

U.S. PATENT DOCUMENTS

| | | | | |
|---|---|---|---|---|
| 4,347,479 A | * | 8/1982 | Cullet ........................ 324/716 |
| 4,475,811 A | * | 10/1984 | Brunner ............... 324/158.1 X |
| 4,516,071 A | * | 5/1985 | Bucher ........................ 324/765 |
| 4,782,288 A | * | 11/1988 | Vento .......................... 324/765 |
| 5,044,750 A | * | 9/1991 | Shamble .............. 324/158.1 X |
| 5,288,572 A | * | 2/1994 | Giapis et al. ................. 430/30 |
| 5,373,232 A | * | 12/1994 | Cresswell et al. ........ 324/158.1 |
| 5,383,136 A | * | 1/1995 | Cresswell et al. .......... 324/716 |
| 5,602,492 A | * | 2/1997 | Cresswell et al. .......... 324/763 |
| 5,712,707 A | | 1/1998 | Ausschnitt et al. |
| 5,731,877 A | | 3/1998 | Ausschnitt |
| 5,757,507 A | | 5/1998 | Ausschnitt et al. |
| 5,805,290 A | | 9/1998 | Ausschnitt et al. |
| 5,857,258 A | * | 1/1999 | Penzes et al. ........... 324/765 X |
| 5,953,128 A | | 9/1999 | Ausschnitt et al. |
| 5,965,309 A | | 10/1999 | Ausschnitt et al. |
| 5,976,740 A | | 11/1999 | Ausschnitt et al. |
| 6,004,706 A | | 12/1999 | Ausschnitt et al. |
| 6,027,842 A | | 2/2000 | Ausschnitt et al. |
| 6,063,531 A | * | 5/2000 | Singh et al. .................. 430/30 |

OTHER PUBLICATIONS

Christopher P. Ausschnitt, *Electrical Measurements for Characterizing Lithography*, VLSI Electronics Microstructure Science, vol. 16, pp. 320–356.

* cited by examiner

Primary Examiner—N. Le
Assistant Examiner—T. R. Sundaram
(74) Attorney, Agent, or Firm—DeLio & Peterson, LLC; Peter W. Peterson; Susan M. Murray

(57) ABSTRACT

A monitor for electrically testing energy beam dose or focus of a layer formed on a substrate by lithographic processing. The monitor comprises a substrate having in a lithographically formed layer an array of electrically conductive elements comprising a plurality of spaced, substantially parallel elements having a length and a width, with the individual elements being electrically connected, and the lengths of the elements being sensitive to dose and focus of an energy beam in lithographically forming the layer. The monitor further includes at least one pad electrically connected to the array to apply current through the array elements. Upon applying a voltage across the array elements, the suitability of dose or focus of the lithographically formed layer may be determined by the resistance of the array. Preferably, ends of the individual elements are aligned along essentially straight lines to form an array edge.

24 Claims, 9 Drawing Sheets

Ln = Nominal Length
Lp = Printed Length
Wn = Nominal Width
Wp = Printed Width

ELECTRICALLY TESTABLE PROCESS WINDOW MONITOR FOR LITHOGRAPHIC PROCESSING

BACKGROUND OF THE INVENTION

1. Field of the Invention

The present invention relates generally to manufacturing processes requiring lithography and, more particularly, to monitoring of lithographic and etch process conditions used in microelectronics manufacturing which is particularly useful for monitoring pattern features with dimensions on the order of less than 0.5 micron.

2. Description of Related Art

Control of a lithographic imaging process requires the optimization of exposure and focus conditions in lithographic processing of product substrates or wafers. Likewise, it is also important to optimize etching and other parameters on product wafers. Generally, because of the variations in exposure and focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term "bias" is invariably used in conjunction with a process such as resist imaging, etching, developing etc. and described by terms such as image bias, etch bias, print bias, etc.

Prior solutions to the above problems entail the collection and analysis of critical dimension measurements using SEM metrology on multiple pattern types at multiple locations within the chip, and from chip-to-chip. This method is slow, expensive and error-prone. It usually requires the exposure of multiple focus-exposure and etching matrices on product wafers.

More recent lithographic monitoring improvements have been in optical metrology which rely on human or machine-read visual measurement of targets which employ arrays of elements having line widths and spacing below the wavelength of the light used to make the measurements. Improvements in monitoring bias in lithographic and etch processes used in microelectronics manufacturing have been disclosed in U.S. Pat. Nos. 5,712,707; 5,731,877; 5,757,507; 5,805,290; 5,953,128; 5,965,309; 5,976,740; 6,004,706 and 6,027,842, the disclosures of which are hereby incorporated by reference. In U.S. Pat. No. 5,757,507, a method of monitoring features on a target using an image shortening phenomenon was disclosed. In U.S. Pat. No. 5,712,707, targets and measurement methods using verniers were disclosed to measure bias and overlay error. In these applications, the targets comprised arrays of spaced, parallel elements having a length and a width, with the ends of the elements forming the edges of the array. While the targets and measurement methods of these applications are exceedingly useful, they rely on the increased sensitivity to process variation provided by image shortening. Some of these types of targets use image shortening effects to make the visual measurements of even though the individual array elements are not resolvable. Examples of such targets are disclosed in the aforementioned U.S. patents. Such targets permit visual monitoring of pattern features of arbitrary shape with dimensions on the order of less than 0.5 micron, and which is inexpensive to implement, fast in operation and simple to automate. These determine bias to enable in-line lithography/etch control using optical metrology, and wherein SEM and/or AFM metrology is required only for calibration purposes.

While these methods provide good visual monitoring, electrical monitoring methods to measure pattern dimensions in lithographic processes would provide useful precision, speed and automation. Some of such processes are disclosed in the article by Christopher P. Ausschnitt entitled Electrical Measurements For Characterizing Lithography, VLSI Electronics Microstructure Science, Vol. 16 (1987). Such methods include the use of electrical test structures in the characterization and control of lithography and etch processes. As described in the above reference, the electrical test structures and methods used to date are applicable only to the measurement of line width. Furthermore, they do not enable the distinguishing of dose and focus effects.

Bearing in mind the problems and deficiencies of the prior art, it is therefore an object of the present invention to provide an improved monitor and evaluation method for determining exposure and focus conditions in lithographic processing of semiconductor structures using electrical measurements of image shortening for both line and space patterns.

It is another object of the invention to provide electrically testable structures to measure, characterize and monitor image shortening.

It is another object of the present invention to provide an electrically testable structure to solve relative dose and focus problems in lithographic processing.

A further object of the invention is to provide a method of electrically testing lithographically applied layers for optimum dose and focus.

It is yet another object of the present invention to provide a method of evaluating focus-exposure parameters which is easy and inexpensive to utilize.

It is a further object of the present invention to provide a method and monitor which electrically measures focus and exposure in lithographically deposited patterns, and which utilize little space on a wafer substrate.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a monitor for electrically testing image shortening of a pattern, preferably energy beam dose or focus of a layer formed on a substrate by lithographic processing. The monitor comprises a substrate having in a lithographically formed layer an array of electrically conductive elements comprising a plurality of spaced, substantially parallel elements having a length and a width, with the individual elements being electrically connected, and the lengths of the elements being sensitive to dose and focus of an energy beam in lithographically forming the layer. The monitor further includes at least one pad electrically connected to the array to apply current through the array elements. Upon applying a voltage and driving a current across the array elements, the suitability of dose or focus of the lithographically formed layer may be determined by the resistance of the array. Preferably, ends of the individual elements are aligned along essentially straight lines to form an array edge.

In another aspect, the present invention provides a monitor for electrically testing image shortening of a pattern, preferably energy beam dose or focus of a layer formed on a substrate by lithographic processing comprising a substrate; a first lithographically formed layer comprising a first electrically conductive area; and a second lithographically formed layer on the substrate. The second lithographically formed layer includes an array of electrically conductive elements having greater conductivity than the first electrically conductive area comprising a plurality of spaced, substantially parallel elements having a length and a width, with ends of the individual elements being aligned to form first and second opposing array edges, and with the individual elements being electrically connected along the first array edge and unconnected across the second array edge, such that the lengths of the elements are sensitive to dose and focus of an energy beam in lithographically forming the layer. The second lithographically formed layer further includes a second electrically conductive area having greater conductivity than the first electrically conductive area and having an edge spaced from the second array edge, with the second array edge and the edge of the second electrically conductive area overlying the first conductive area in the first lithographic layer. Upon applying a voltage and driving a current between the first array edge of the array of electrically conductive elements and the second conductive area so that current flows through the array elements, the first conductive area and the second conductive area, the suitability of dose or focus of the second lithographically formed layer may be determined by the resistance of the array.

Preferably, the ends of the individual elements are aligned along essentially straight lines to form the array edges, and the second array edge and the edge of the second electrically conductive area are essentially parallel. The monitor may further include a pad electrically connected to the array to apply current through the array elements.

In a further aspect, the present invention provides a monitor for electrically testing image shortening of a pattern, preferably energy beam dose or focus of a layer formed on a substrate by lithographic processing comprising a substrate; a first lithographically formed layer comprising a first electrically conductive area; and a second lithographically formed layer on the substrate. The second lithographically formed layer includes a first array of electrically conductive elements having greater conductivity than the first electrically conductive area comprising a plurality of spaced, substantially parallel elements having a length and a width, with ends of the individual elements being aligned to form first and second opposing array edges, and the individual elements being electrically connected along the first array edge and unconnected across the second array edge, such that the lengths of the elements are sensitive to dose and focus of an energy beam in lithographically forming the layer. The second lithographically formed layer also includes a second array of electrically conductive elements having greater conductivity than the first electrically conductive area comprising a plurality of spaced, substantially parallel elements having a length and a width, with ends of the individual elements being aligned to form first and second opposing array edges, and the individual elements being electrically connected along the first array edge and unconnected across the second array edge, such that the lengths of the elements are sensitive to dose and focus of an energy beam in lithographically forming the layer. The second edge of the second array is spaced from the second edge of the first array, with the second edges of the first and second arrays overlying the first conductive area in the first lithographic layer. Upon applying a voltage and driving a current between first array edges of the first and second arrays of electrically conductive elements so that current flows through the first array elements, the first conductive area and the second array elements, the suitability of dose or focus of the second lithographically formed layer may be determined by the resistance of the first and second arrays.

Preferably, the ends of the individual elements are aligned along essentially straight lines to form the array edges, and the second array edges of the first and second arrays of electrically conductive elements are essentially parallel. The monitor may further include a first pad electrically connected to the first array to apply current through the first array elements and a second pad electrically connected to the second array to apply current through the second array elements. The first electrically conductive area of the first lithographically formed layer may underlie the first and second arrays of electrically conductive elements.

In yet another aspect, the present invention provides a monitor for electrically testing image shortening of a pattern, preferably energy beam dose or focus of a layer formed on a substrate by lithographic processing comprising a substrate; and a lithographically formed layer on the substrate having an array of electrically conductive elements having greater conductivity than the first electrically conductive area. The array comprises a plurality of spaced, substantially parallel elements having a length and a width, with ends of the individual elements being aligned to form first and second opposing array edges, and the individual elements being electrically connected by a central conductive element between the first and second array edges and unconnected across the second array edge, such that the lengths of and spaces between the elements being sensitive to dose and focus of an energy beam in lithographically forming the layer. Upon applying a voltage and driving a current across opposing ends of the central conductive element so that current flows through the central conductive element, the suitability of dose or focus of the lithographically formed layer may be determined by the resistance of the central conductive element. The monitor may further include a pair of pads electrically connected to opposing ends of the array to apply current through the central conductive element.

Another aspect of the present invention provides a monitor for electrically testing image shortening of a pattern, preferably energy beam dose or focus of a layer formed on a substrate by lithographic processing comprising a substrate; a first lithographically formed layer comprising a first electrically conductive area; and a second lithographically formed layer on the substrate. The second lithographically formed layer includes a first array of electrically conductive elements having greater conductivity than the first electrically conductive area comprising a plurality of spaced, substantially parallel elements having a length and a width, with ends of the individual elements being aligned to form first and second opposing array edges, and the individual elements being electrically connected along the first array edge and unconnected across the second array edge, such that the lengths of the elements are sensitive to dose and focus of an energy beam in lithographically forming the layer. The second lithographically formed layer also includes a second array of electrically conductive elements having greater conductivity than the first electrically conductive area comprising a plurality of spaced, substantially parallel elements having a length and a width, with ends of the individual elements being aligned to form first and second opposing array edges, and the individual elements being electrically connected along the first array edge and unconnected across the second array edge, such that the lengths of the elements are sensitive to dose and focus of an energy beam in lithographically forming the layer. The second edge of the second array is spaced from the second edge of the first array, and the second edges of the first and second arrays overlie the first conductive area in the first lithographic layer. The second lithographically formed layer further includes a third array of electrically conductive elements comprising a plurality of spaced, substantially parallel elements having a length and a width, with ends of the individual elements being aligned to form first and second opposing array edges, and the individual elements being electrically connected by a central conductive element between the first and second array edges and unconnected across the second array edge, such that the lengths of and spaces between the elements are sensitive to dose and focus of an energy beam in lithographically forming the layer. One end of the central conductive element is electrically connected to first array edge of the second array of electrically conductive elements. Upon applying a voltage and driving a current between the first array edge of the first array of electrically conductive elements and the other end of the central conductive element so that current flows through the first array elements, the first conductive area, the second array elements and the central conductive element, the suitability of dose or focus of the second lithographically formed layer may be determined by the resistance of the first and second arrays and the central conductive element.

The monitor may further include a first pad electrically connected to the first array edge of the first array to apply current through the first array elements and a second pad electrically connected to the other end of the central conductive element to apply current through the central conductive element. The third array of electrically conductive elements has greater conductivity than the first electrically conductive area of the first lithographically formed layer and the first electrically conductive area underlies the first, second and third arrays of electrically conductive elements.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
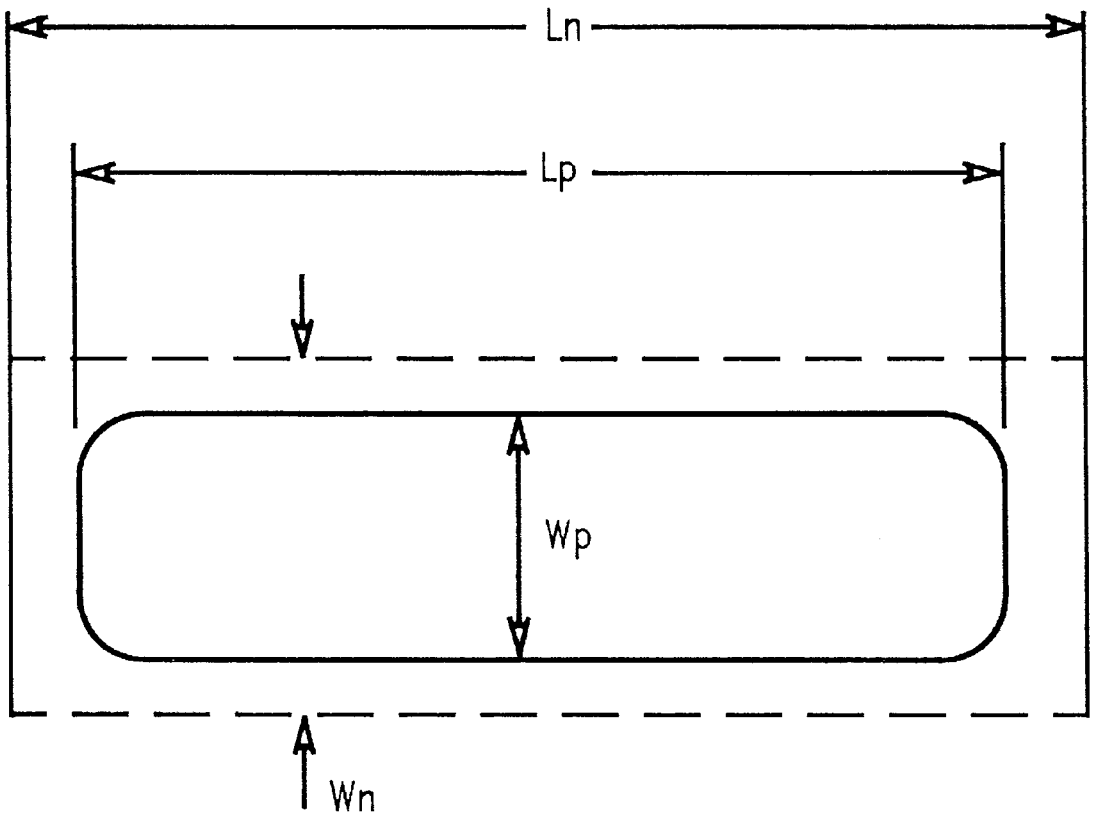
FIG. 1 is a top plan view of an element illustrating image shortening effect.

In describing the preferred embodiment of the present invention, reference will be made herein to FIGS. 1–10 of the drawings in which like numerals refer to like features of the invention. Features of the invention are not necessarily shown to scale in the drawings.

The concept of image shortening in photolithographic targets is disclosed in U.S. Pat. Nos. 5,712,707 and 5,976,740, the disclosures of which are hereby incorporated by reference. The concept of image shortening is incorporated in the present invention which provides not a visual test pattern or target, but instead an electrically testable image shortening monitor to simultaneously measure both line-length and space-length variation. As disclosed in U.S. Pat. No. 5,976,740 the simultaneous tracking of line and space length enables the unique solution of relative dose and focus measurements. By measuring the resistance of structures affected by this image shortening phenomena, it is possible to calibrate where the lithographic process is in the dose-focus space electrically. In addition, it is possible to discern the offsets in ideal dose and focus within the same field, wafer or lot.

Referring to FIG. 1, for a line or space, whose nominal length ($L_n$) is greater than its nominal width ($W_n$), the pattern imaged by a lithography tool in photoresist will have printed dimensions $L_p$, $W_p$. Image shortening or foreshortening describes the case where the printer bias of the length ($L_n-L_p$) exceeds the print bias of the width ($W_n-W_p$). The image shortening effect becomes pronounced as the resolution limit of the lithography tool/process is approached.

Factors that contribute to image shortening include the following:

(1) The corners that must form the ends of the line or space contribute higher spatial frequency components relative to the middle of the line or space.

Consequently, a given imaging system cannot resolve the ends as well as the middle, and a portion of the shortening is present in the aerial image.

(2) The photoactive compound (PAC) is the key chemical component for image formation in all photoresists. Diffusion of the PAC occurs within the photoresist film during expose and post-expose-bake processes. This diffusion will enhance the shortening as the width of the line or space approaches the diffusion length.

(3) The mask itself can contribute to shortening due to the resolution/process limitations inherent in mask patterning, these effects will be most severe for 1× masks, but can also be significant on 5× or 10× masks in the form of corner rounding and/or foreshortening on the mask. Corner rounding on the mask will enhance the shortening present in the aerial image of the lithography tool.

(4) Resist stress relief at develop could also lead to shortening effects.

Measurements have been made of the increased sensitivity of the length dimension to exposures and focus variation relative to the width dimension. For example, the experimental data shows the effect of exposure dosage on the width and length dimension of a line for different focus conditions. From the data, comparing the dependence of the length dimension on exposure to that of the width, where the nominal line width is 250 nm and the nominal line length is 2 um, it can be concluded that the sensitivity of the width bias to exposure (slope) is approximately 17 nm/mj/cm$^2$, and the sensitivity of the length bias to exposure (slope) is approximately 29 nm/mj/cm$^2$. Thus the length shows approximately 1.7× greater sensitivity to exposure variation than does the width. For a given process, the magnitude of this sensitivity factor is dependent on factors that affect image shortening as described above.

Further, comparisons of the dependence of the length on focus to that of the width have also shown that the length shows significantly greater deviation from nominal with defocus. The data shows that length bias is at least equal or more sensitive to exposure than width bias and shows a trend with the minimum feature size. Length bias is also predictable from length bias measurement, and the length sensitivity relative to the width increases as the nominal width decreases.

Figure 2:
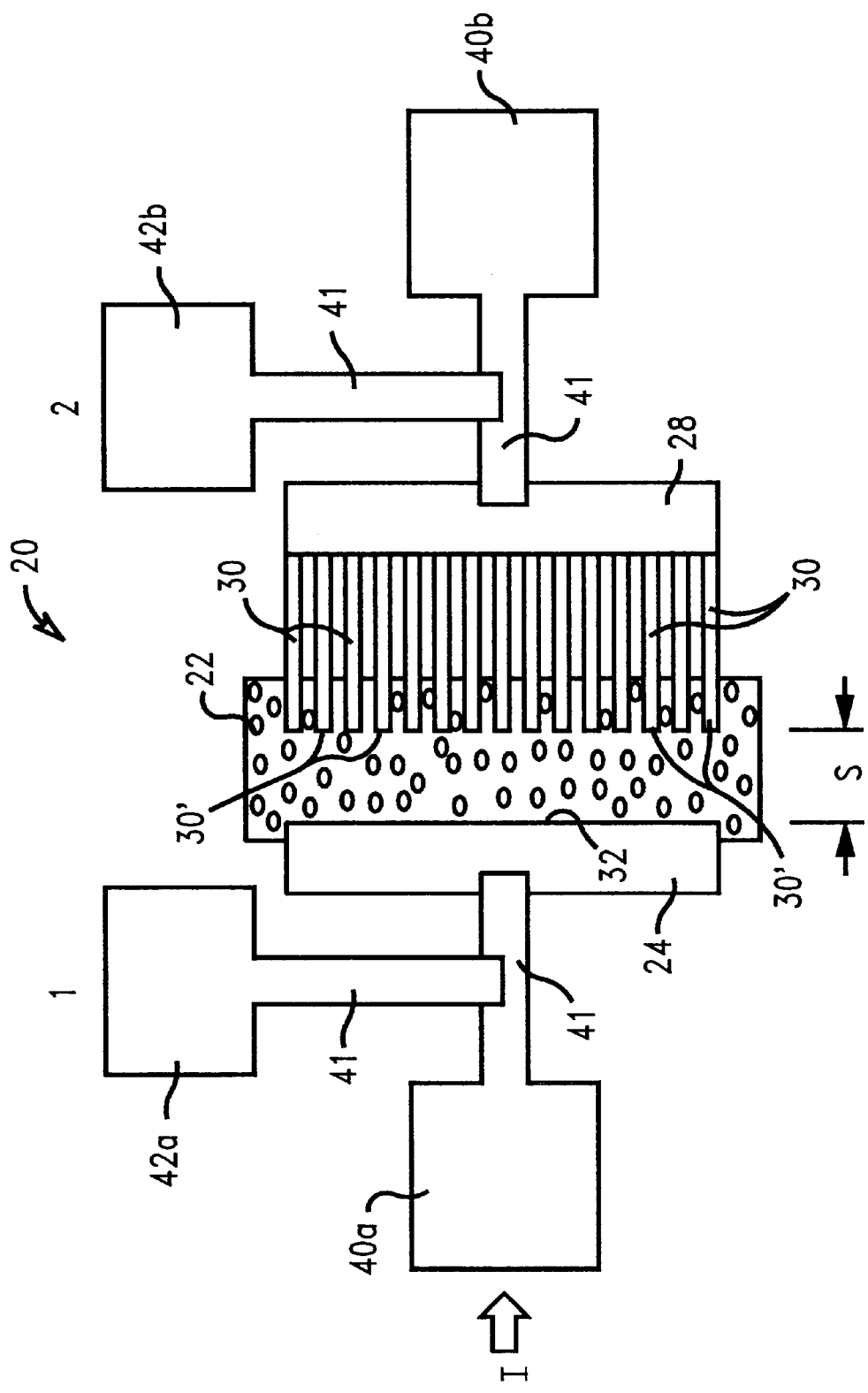
FIG. 2 is a top plan view of a first embodiment of the electrically testable monitor of the present invention for measuring image shortening using two patterned films of differing resistivity on a non-conductive substrate.

A first embodiment of the electrically testable dose-focus monitor of the present invention is depicted in FIG. 2. The monitor 20 comprises a first element or area 22, here shown in rectangular form made by depositing an electrically conductive material having a controlled resistivity and patterning it by conventional lithography and etch. Element 22 is formed on a selected layer of substrate or wafer prior to the formation of the remaining structures shown for monitor 20. Overlying portions of conductive area 22 and formed in a subsequent lithographic layer, is a second electrically conductive element or area 24 shown in rectangular configuration with a portion overlying element 22 and the remaining portion over the other substrate areas. Also, overlying a portion of element 22 and spaced from element 24 are an array of a plurality of parallel spaced line elements 30 in which each individual line element has a length (shown from right to left) which is substantially greater than its width. Preferably, the individual line elements 30 are of equal length so that the opposite left and right array edges, formed by the line ends, are straight and parallel, and the left array edge, made up of line ends 30', is parallel to the right edge 32 of conductive element 24. The array of line elements is spaced a distance s on the left end from element 24 and on the right end is connected by element 28. Elements 24, 28, and 30 are all made from a film or layer of a deposited electrically conductive material, patterned by conventional lithography and etch, which is of greater conductivity than the material from which underlying element 22 is made. While element 22 may be made from a material such as doped polycrystalline silicon, elements 24, 28 and 30 are preferably made from an alloy or metal such as aluminum or copper. Elements 22, 24, 28 and 30 may also be made from the same material, such as doped polysilicon, whose conductivity is varied in the different regions by a sequence of patterning and doping steps. Because array line elements 30 each have a length substantially greater than the width, they are subject to the line shortening effect as a result of exposure and dose parameters in the lithographic deposition process.

The remainder of monitor 20 comprises electrical conductors 41 which respectively link elements 24 and 28 to pads 40a, 40b for driving current across the monitor and pads 42a, 42b for measuring voltage drop to determine the resistance to the current across the monitor. Conductors 41, 40a, 40b, 42a, 42b are preferably lithographically defined in the same layer as elements 24, 28 and 30 and are made of the same conductive material.

The spacing s between the right most straight edge 32 of element 24 and the left most element edges 30' which make up the array determines the overall resistance of monitor 20 as read across pads 42a, 42b when current is driven across pads 40a, 40b. This spacing s will change depending on the exposure and dose parameters of the lithography step that patterns 30 and 32 which will, shorten the length of line elements 30 to a varying degree depending on the precision of exposure and dose applied during the photolithographic process. Accordingly, instead of measuring the line shortening effect visually, the monitor 20 permits an electrical measurement of the line shortening effect of the elements 30 in the array. By printing a multiplicity of electrically probeable targets at different designated spacings s between 24 and 30, and different design line dimensions 30 and spacings between lines 31, the line-shortening behavior of the patterning process used to produce 30 can be fully characterized as a function of pattern proximity using electrical measurement.

Figure 3:
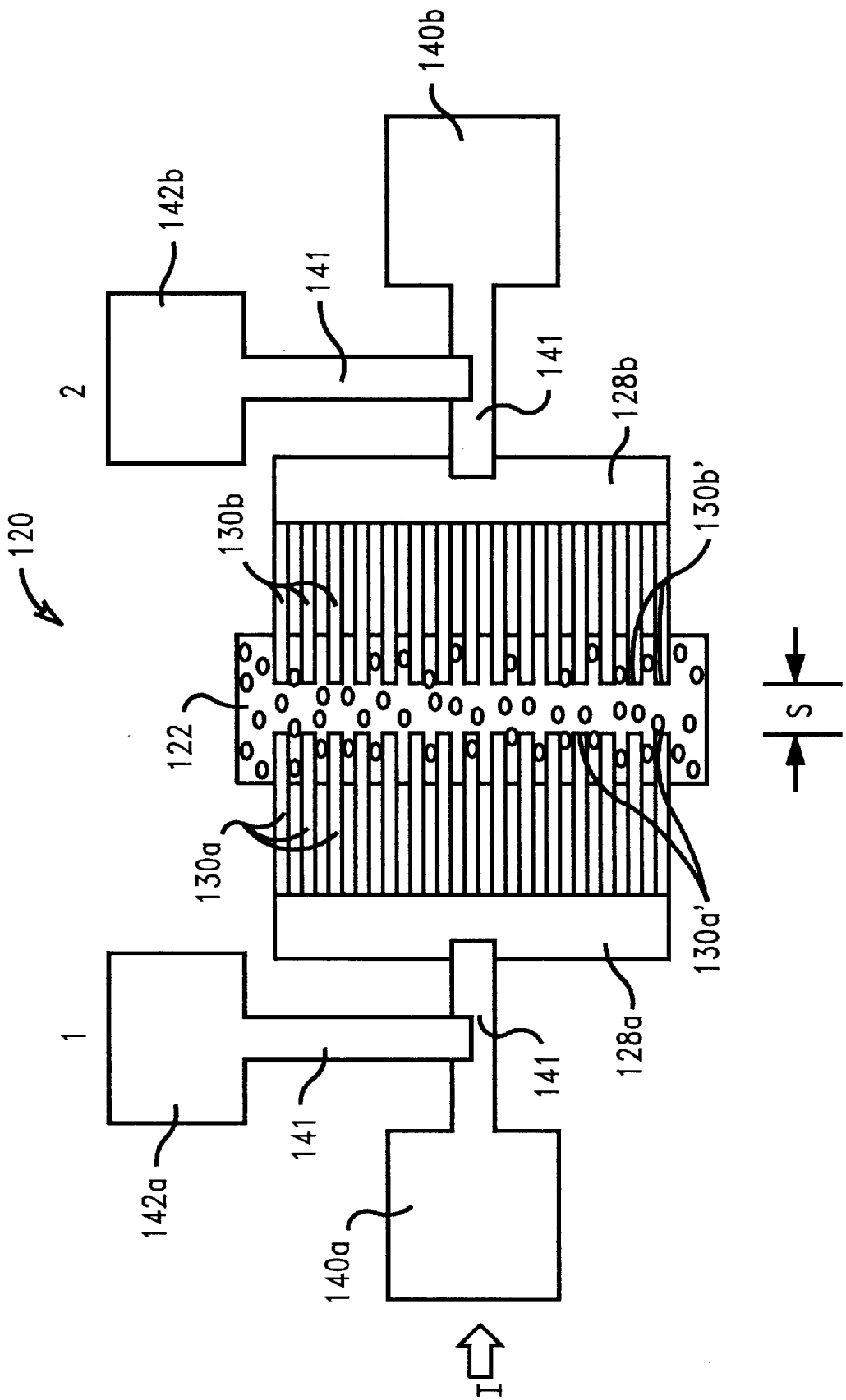
FIG. 3 is a top plan view of a variation of the electrically testable image-shortening monitor embodiment of FIG. 2.

A variation of the embodiment of FIG. 2 is depicted in FIG. 3 for monitor 120. The underlying lithographically deposited conductive layer 122 of controlled resistivity corresponds to element 22 in FIG. 1. The overlying lithographically deposited arrays elements 130b having ends 130b' and electrically connected by element 128b all correspond to elements 30, 30' and 28 of FIG. 2. However, instead of rectangular element 24, there is provided further array of line elements 130a connected by element 128a which is essentially the mirror image of line elements 130b and connecting element 128b. The facing edges 130a', 130b' of the line element arrays 130a, 130b, respectively, are preferably straight and essentially parallel. Conductive voltage pads 140a, 140b and resistance measurement pads 142a, 142b are connected by conductors 141 to elements 128a, 128b, respectively, in a manner analogous to that of FIG. 2, and a voltage is applied and resistance readings taken in the same manner. The spacing s between element ends 130a' and 130b' is variable because of line shortening effects during lithographic processing, and will appear as a change in resistance of monitor 120. The advantage of this embodiment over that of FIG. 2 is that the line shortening effect occurs on both sets of array elements 130a and 130b so that the change if any will be magnified, up to 2× greater, than the space change to be expected from the embodiment of FIG. 2. A further advantage is that it avoids any admixture of error due to the sensitivity of the structure 32 to lithographic conditions.

Figure 4:
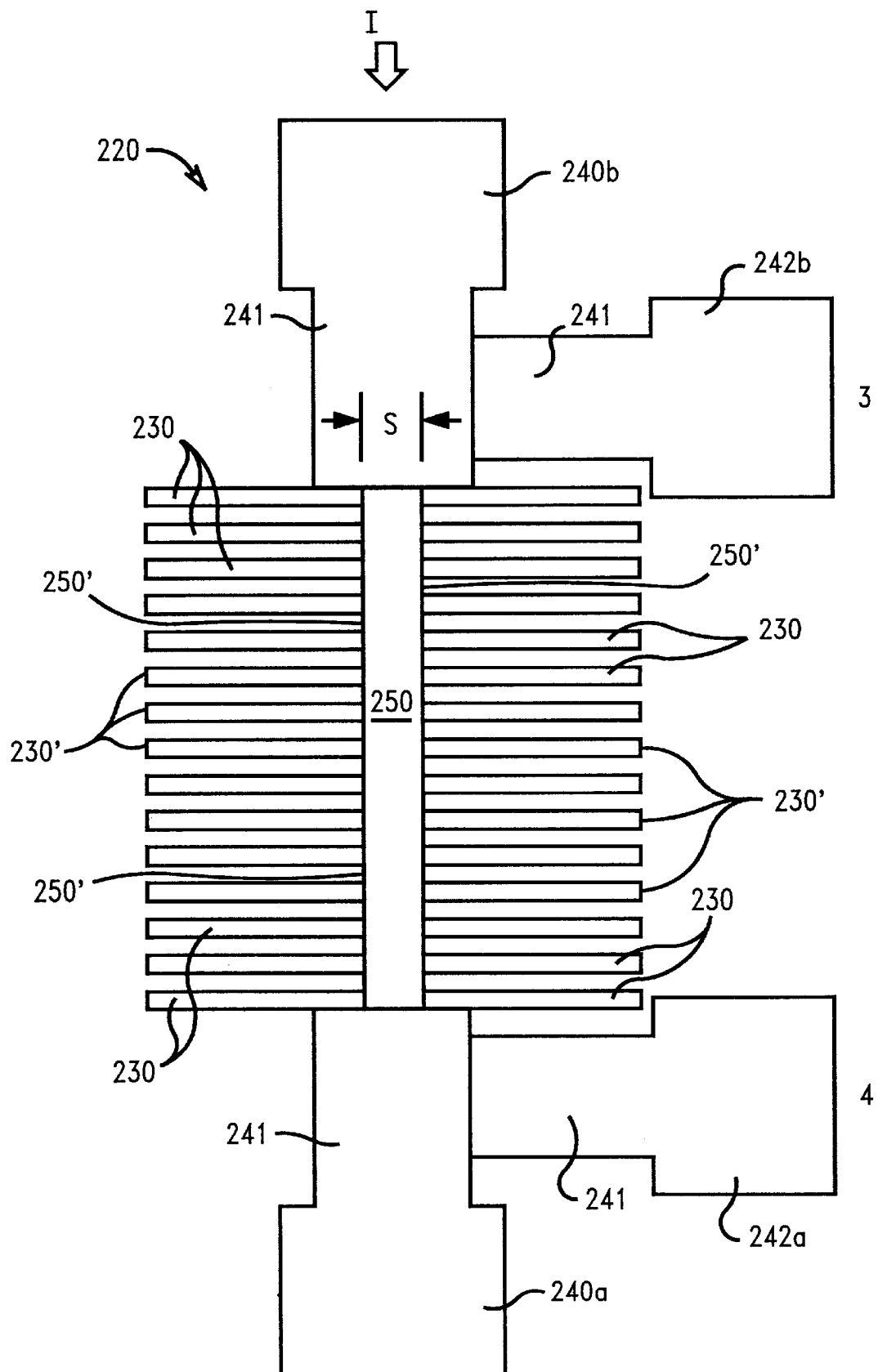
FIG. 4 is a top plan view of an embodiment of the electrically testable monitor of the present invention for measuring image shortening using single conductive film on a nonconductive substrate.

A further embodiment of the electrically testable process window monitor of the present invention is depicted in FIG. 4. Here, in monitor 220, again there are a plurality of spaced parallel array line elements 230, each having a length greater than the width. However, the monitor 220 may be made and formed on a single lithographic layer, as opposed to the dual layers of the preferred embodiment of FIGS. 2 and 3. This is accomplished by electrically connecting array elements 230 by a central conductive element 250 which is disposed between the ends of the individual array elements, in a direction essentially perpendicular to the direction of the individual array elements. The right and left edges 250' of central conductive element 250 are preferably straight and essentially parallel. The individual array element ends 230' remain unconnected. In a manner analogous to the image shortening effect of the individual array elements, changes in exposure and focus during lithographic processing causes shortening of the ends of the spaces between the individual array elements at the area of intersection with central elements 250. The shortening effect of these spaces results in differences in the width s (from left to right as shown in FIG. 4) of central element 250 as measured at edges 250'. Changes in the actual width of element edges 250' will result in a change in resistance of the element to current passing there through. Since current does not flow in the elements 230 and 230', the change in the resistance of the elements 250' results in a change in the overall resistance of the central element 250. To drive the current, there are provided conductive pads 240a, 240b connected by conductors 241 to the opposite ends of central element 250 and monitor 220. When a current is driven across the monitor 220, the voltage may be read across pads 242a, 242b connected by conductors 241 across monitor 220 in order to determine the resistance of the monitor. The space-end shortening effect due to variations in exposure will cause changes in the resistance measurement which can then be utilized to determine the dependence of the space length on lithographic and processing conditions.

Figure 5:
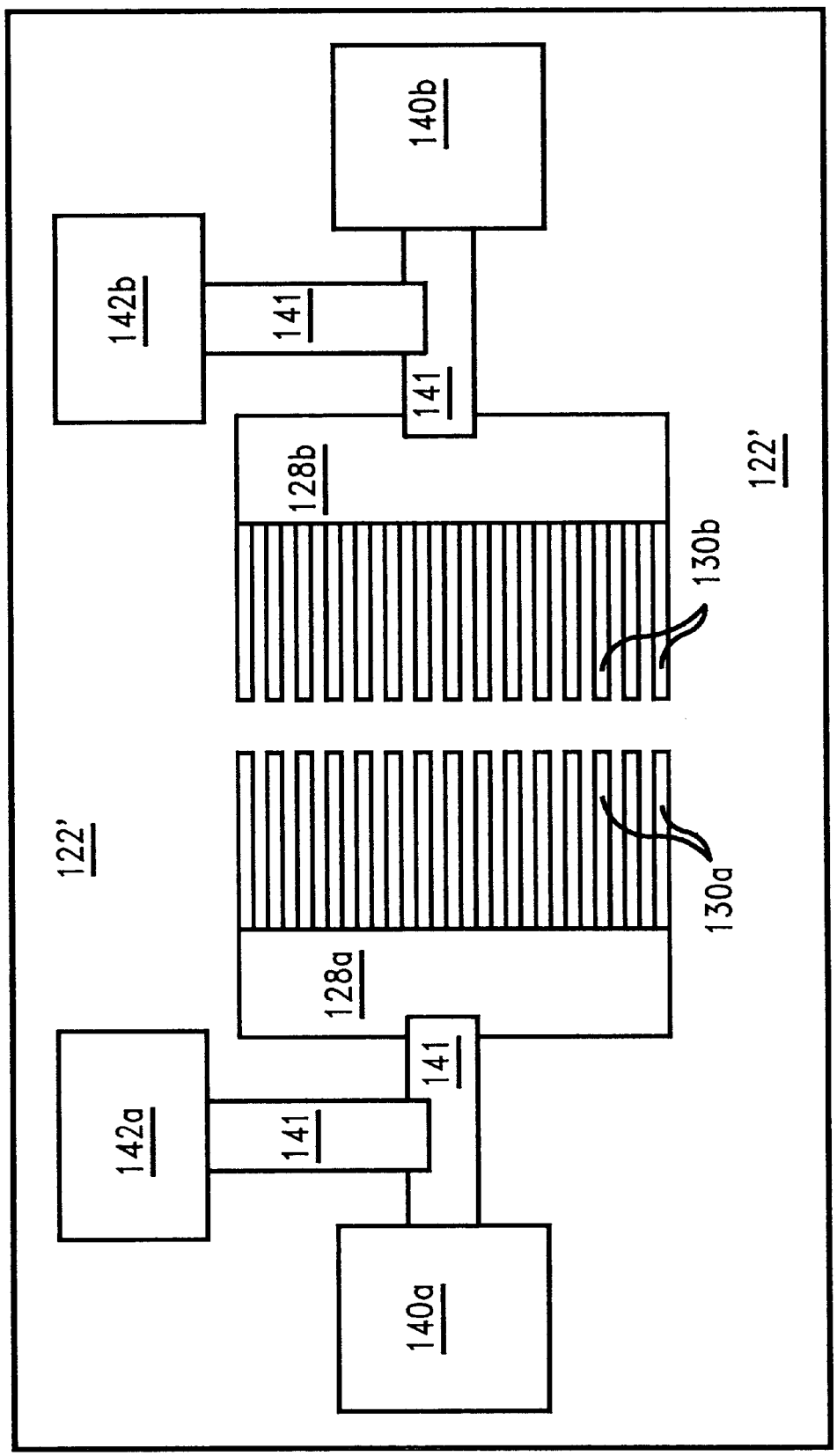
FIG. 5 is a top plan view of a variation of the electrically testable image-shortening monitor embodiment of FIG. 3, using a pattern in a conductive film of low resistivity superimposed on an unpatterned substrate of high resistivity.

A further embodiment of the electrically testable process window monitor of the present invention is depicted in FIG. 5. The difference relative to FIG. 3 is that the underlying low conductivity region 122' covers the entire substrate and underlies the entirety of the arrays, conductors and pads of the monitor, rather than just the rectangular region spanning the line ends shown in FIG. 3. The advantage of this configuration is that patterning of the low conductivity layer is not required, greatly simplifying the fabrication process. To keep the undesired contribution of leakage current through the substrate below an acceptable level, however, this embodiment sets additional constraints on the low conductivity of the substrate relative to the high conductivity of the patterned area and the nominal distance among the patterned areas relative to the nominal distance s between the line ends. In particular, the leakage resistance must be much greater than the resistance across s.

Figure 6:
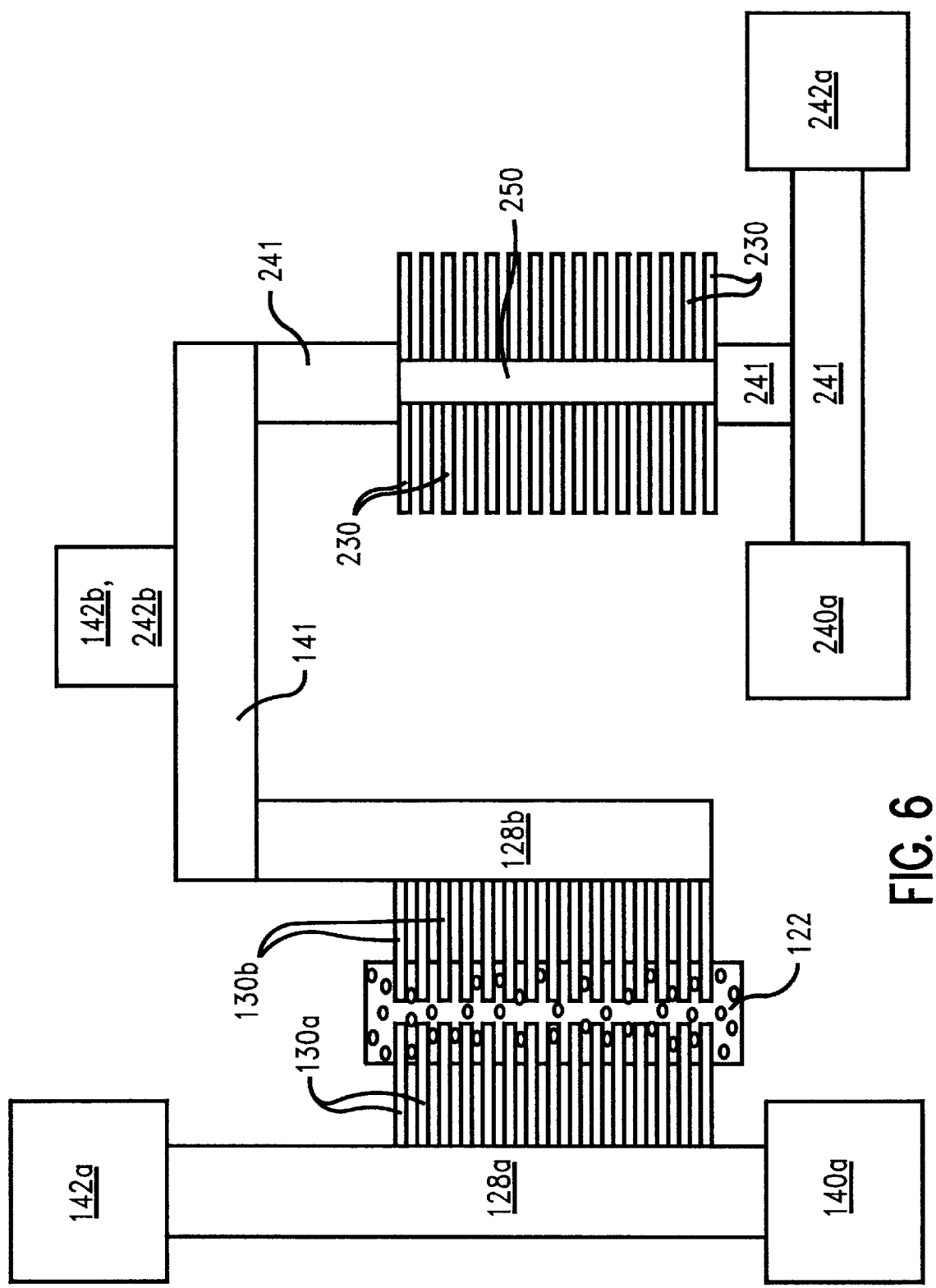
FIG. 6 is a top plan view of an embodiment of an electrically testable line-shortening shortening and space-shortening monitor of the present invention using a pattern in a conductive film of low resistivity superimposed on a rectangular pattern, in a film of higher resistivity, straddling the line ends.

FIG. 6 shows an embodiment of the present invention that combines the electrically testable monitors of FIGS. 3 and 4 in a single electrically testable monitor. The advantage of this embodiment is that the behavior of both lithographic tones, line and space lengths, can be monitored simultaneously. As disclosed in U.S. Pat. No. 5,976,740 the simultaneous tracking of line and space length enables the unique solution of relative dose and focus, the critical lithographic parameters. Under constant lithographic conditions, as disclosed in U.S. Pat. No. 6,027,842, the simultaneous tracking of line and space length also enables the unique solution of relative etch rate and isotropy, the critical etch parameters.

Figure 7:
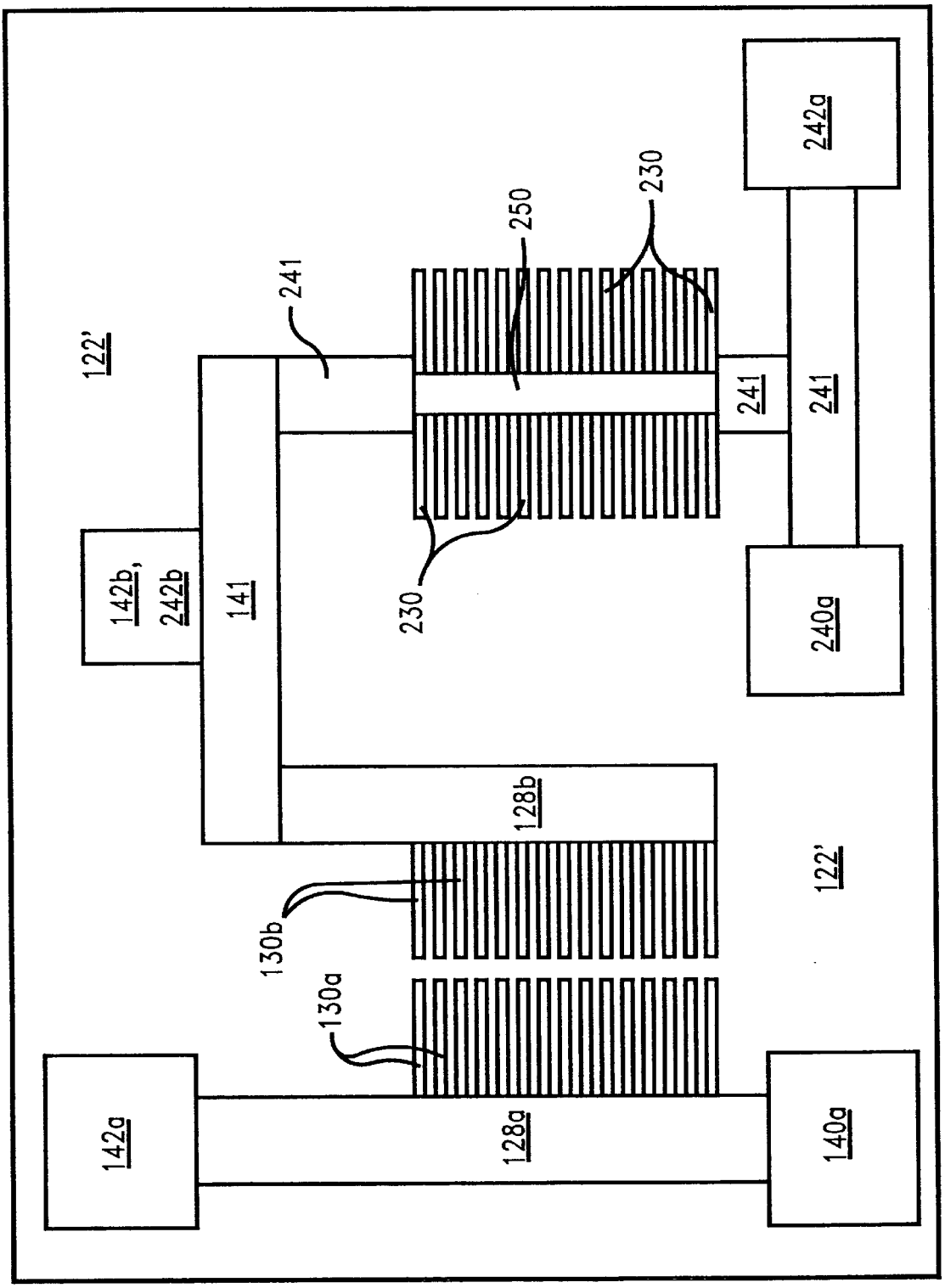
FIG. 7 is a top plan view of a variation of the electrically testable line-shortening and space shortening monitor of FIG. 6, using a pattern in a conductive film superimposed an unpatterned substrate of higher resistivity.

FIG. 7 shows a variation on the embodiment of FIG. 6 of the present invention that places the electrically testable monitor of FIG. 6 on an unpatterned low conductivity substrate 122', which underlies the entirety of the arrays, conductors, conductive element and pads of the monitor. This has the same advantage and imposes the same constraint as the embodiment illustrated in FIG. 5.

Figure 9:
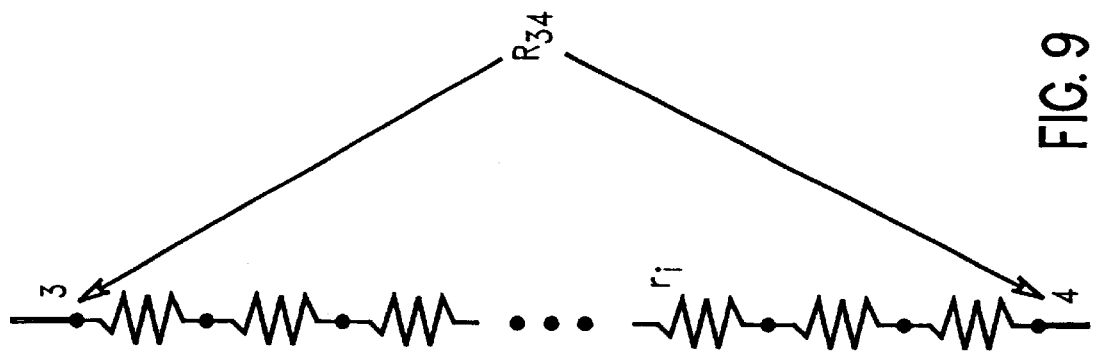
FIG. 9 is an electrical schematic of the circuit represented in FIG. 4.
Figure 8:
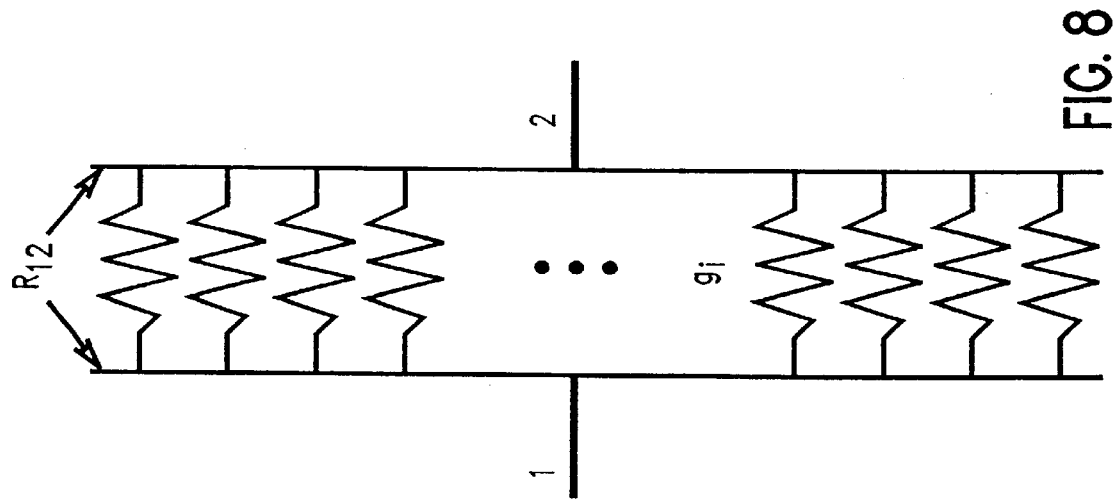
FIG. 8 is electrical schematic of the circuits represented in FIGS. 2 and 3.
Figure 10:
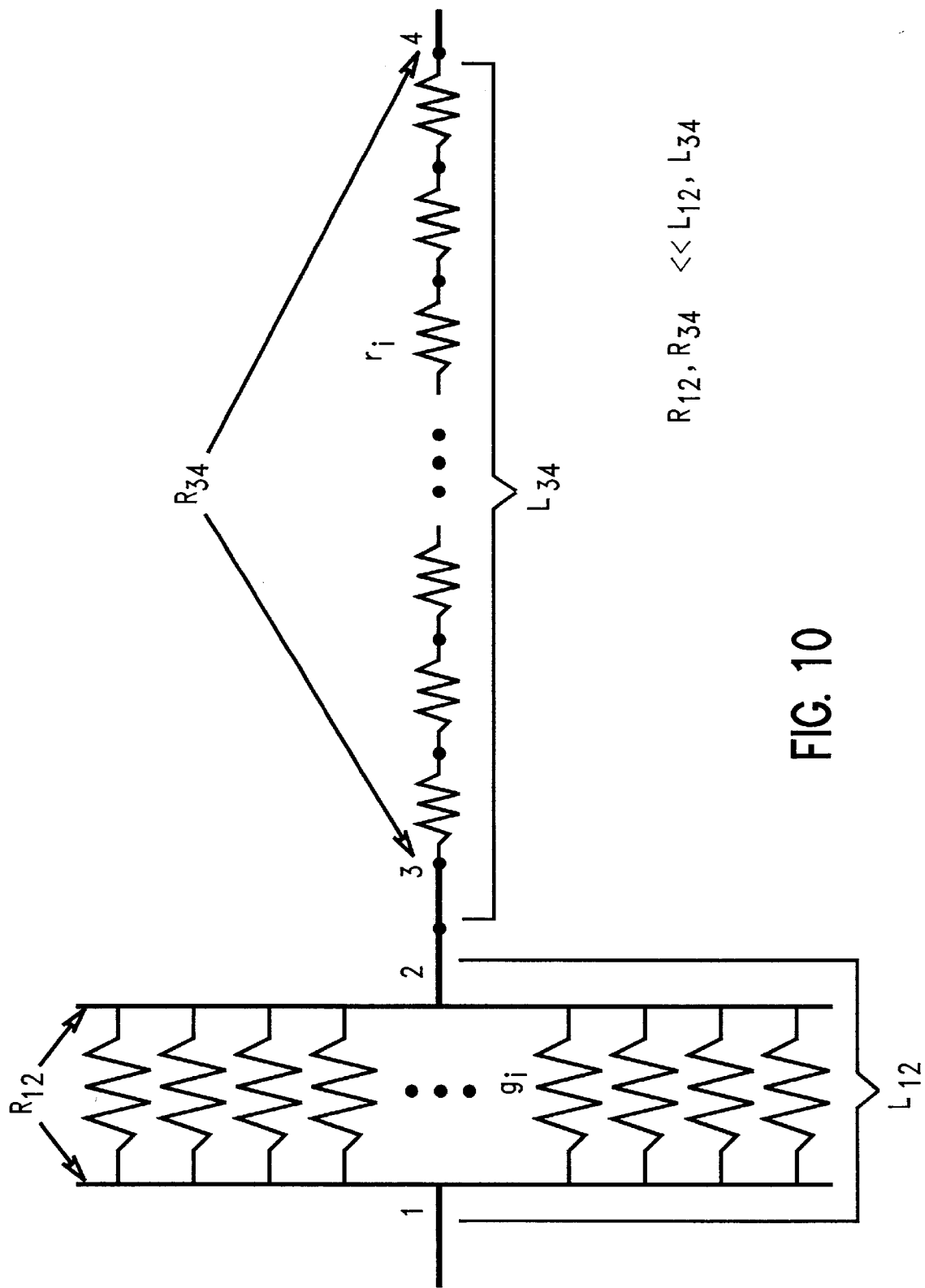
FIG. 10 is an electrical schematic of the circuit represented in FIG. 6.

FIGS. 8 and 9 show electrical schematics of the monitor embodiments of FIGS. 3 and 4 respectively. FIG. 10 shows an electrical schematic of the monitor embodiment of FIG. 6, which is itself a combination of the monitor embodiments of FIGS. 3 and 4. Points 1 and 2 in FIG. 3 correspond to points 1 and 2, respectively, in FIGS. 8 and 10, and points 3 and 4 in FIG. 3 correspond to points 3 and 4, respectively, in FIGS. 9 and 10. As shown in FIG. 8, the embodiment of FIG. 3 acts as a set of resistors connected in parallel, such that the total conductance is the sum of the conductances $g_i$ corresponding to the inverse of the resistance to the current traveling parallel to and across any pair of opposing line elements separated by the distance s. As shown in FIG. 9, the embodiment of FIG. 4 acts as a set of resistors connected in series, such that the total resistance is the sum of the resistances $r_i$ corresponding to the resistance to the current traveling perpendicular to and between the opposing space elements separated by s.

As shown in FIG. 10, the embodiment of FIG. 6 acts as a set of resistors connected in parallel and connected in series with another set of resistors connected in series. The leakage resistance between points 1 and 2, $L_{12}$ and the leakage resistance between points 3 and 4, $L_{34}$, are shown. Preferably, both the resistance between points 1 and 2, $R_{12}$ and the resistance between points 3 and 4, $R_{34}$, are much less than either $L_{12}$ or $L_{34}$.

To establish a reasonable operating regime for the electrically testable monitors corresponding to current lithography capability, it is useful to consider an example:

Resistivity: $\rho_1 = 250\Omega/$; (doped poly-silicon), $\rho_2 = 0.25\Omega/$; (metal film)

Linewidth/spacewidth: 0.15 $\mu$m

Line/space separation: s=0.3 $\mu$m

Number of line/space elements: 50

Under the above conditions we can estimate the resistance R across the electrical monitors:

$R_{12} = 2 \times 250/50 = 10\Omega$ $R_{34} = 50 \times 0.25/2 = 6\Omega$

These values of resistance fall in a range that can be measured easily with better than 0.1% precision using conventional electrical probe techniques.

In operation, any of the electrically testable monitors made in accordance with the present invention may be fabricated on test wafers for the characterization of lithography and/or etch processes or included in a particular semiconductor product layer comprised of appropriate conductive materials and whose exposure and/or dose parameters are to be measured. By quickly and easily driving a fixed current across the monitor and reading and recording the voltage utilizing well known devices, the resistance of the monitor may be determined. Such resistance may be prepared to a measurement taken under varying lithographic and/or etch conditions in order to determine whether the actual process conditions comply with the manufacturing requirements.

Accordingly, the present invention provides an electrically testable structure to solve relative dose, focus and etch problems which is easy and inexpensive to utilize and which utilizes little space on a wafer substrate. The electrically testable monitor of the present invention is particularly useful for automated systems and do not require visual monitoring.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A monitor for electrically testing image shortening of a pattern formed on a substrate by lithographic or etch processing comprising a substrate having in a lithographically formed layer an array of electrically conductive elements comprising a plurality of spaced, substantially parallel elements having a length and a width, the individual elements being electrically connected, the lengths of said elements being sensitive to processing of said layer, the monitor further including at least one pad electrically connected to the array to apply current through the array elements wherein, sensitive to processing of said layer, the monitor further including at least one pad electrically connected to the array to apply current through the array elements wherein, upon applying a voltage across the array elements, the suitability of the layer may be determined by the resistance as affected by line shortening effects to the lengths of the electrically conductive elements of the array.

2. The monitor of claim 1 wherein ends of the individual elements are aligned along essentially straight lines to form an array edge.

3. A monitor for electrically testing image shortening of a pattern formed on a substrate by lithographic or etch processing comprising:
    a substrate;
    a first lithographically formed layer comprising a first electrically conductive area; and
    a second lithographically formed layer on the substrate having i) an array of electrically conductive elements having greater conductivity than the first electrically conductive area comprising a plurality of spaced, substantially parallel elements having a length and a width, ends of the individual elements being aligned to form first and second opposing array edges, the individual elements being electrically connected along the first array edge and unconnected across the second array edge, the lengths of said elements being sensitive to processing of said layer; and ii) a second electrically conductive area having greater conductivity than the first electrically conductive area and having an edge spaced from the second array edge, the second array edge and the edge of the second electrically conductive area overlying the first conductive area in the first lithographic layer,
wherein, upon applying a voltage between the first array edge of the array of electrically conductive elements and the second conductive area so that current flows through the array elements, the first conductive area and the second conductive area, the suitability of the second layer may be determined by the resistance as affected by line shortening effects to the lengths of the electrically conductive elements of the array.

4. The monitor of claim 3 wherein ends of the individual elements are aligned along essentially straight lines to form the array edges, and wherein the second array edge and the edge of the second electrically conductive area are essentially parallel.

5. The monitor of claim 3 further including a pad electrically connected to the array to apply current through the array elements.

6. A monitor for electrically testing image shortening of a pattern formed on a substrate by lithographic or etch processing comprising:
    a substrate;
    a first lithographically formed layer comprising a first electrically conductive area; and
    a second lithographically formed layer on the substrate having i) a first array of electrically conductive elements having greater conductivity than the first electrically conductive area comprising a plurality of spaced, substantially parallel elements having a length and a width, ends of the individual elements being aligned to form first and second opposing array edges, the individual elements being electrically connected along the first array edge and unconnected across the second array edge, the lengths of said elements being sensitive to processing of said layer; and ii) a second array of electrically conductive elements having greater conductivity than the first electrically conductive area comprising a plurality of spaced, substantially parallel elements having a length and a width, ends of the individual elements being aligned to form first and second opposing array edges, the individual elements being electrically connected along the first array edge and unconnected across the second array edge, the lengths of said elements being sensitive to processing of said layer, the second edge of the second array being spaced from the second edge of the first array, the second edges of the first and second arrays overlying the first conductive area in the first lithographic layer,
wherein, upon applying a voltage between first array edges of the first and second arrays of electrically conductive elements so that current flows through the first array elements, the first conductive area and the second array elements, the suitability of the second layer may be determined by the resistance as affected by line shortening effects to the lengths of the first and second arrays.

7. The monitor of claim 6 wherein ends of the individual elements are aligned along essentially straight lines to form the array edges, and wherein the second array edges of the first and second arrays of electrically conductive elements are essentially parallel.

8. The monitor of claim 6 further including a first pad electrically connected to the first array to apply current through the first array elements and a second pad electrically connected to the second array to apply current through the second array elements.

9. The monitor of claim 6 wherein the first electrically conductive area of the first lithographically formed layer underlies the first and second arrays of electrically conductive elements.

10. A monitor for electrically testing image shortening of a pattern formed on a substrate by lithographic or etch processing comprising:
    a substrate; and
    a lithographically formed layer on the substrate having an array of electrically conductive elements comprising a plurality of spaced, substantially parallel elements having a length and a width, ends of the individual elements being aligned to form first and second opposing array edges, the individual elements being electrically connected by a central conductive element between the first and second array edges and unconnected across the second array edge, the lengths of and spaces between said elements being sensitive to processing of said layer, wherein, upon applying a voltage across opposing ends of the central conductive element so that current flows through the central conductive element, the suitability of the layer may be determined by the resistance of the central conductive element as affected by shortening effects to the spaces between the elements.

11. The monitor of claim 10 further including a pair of pads electrically connected to opposing ends of the array to apply current through the central conductive element.

12. A monitor for electrically testing image shortening of a pattern formed on a substrate by lithographic processing comprising:

a substrate;

a first lithographically formed layer comprising a first electrically conductive area;

a second lithographically formed layer on the substrate having i) a first array of electrically conductive elements having greater conductivity than the first electrically conductive area comprising a plurality of spaced, substantially parallel elements having a length and a width, ends of the individual elements being aligned to form first and second opposing array edges, the individual elements being electrically connected along the first array edge and unconnected across the second array edge, the lengths of said elements being sensitive to processing of said layer; ii) a second array of electrically conductive elements having greater conductivity than the first electrically conductive area comprising a plurality of spaced, substantially parallel elements having a length and a width, ends of the individual elements being aligned to form first and second opposing array edges, the individual elements being electrically connected along the first array edge and unconnected across the second array edge, the lengths of said elements being sensitive to processing of said layer, the second edge of the second array being spaced from the second edge of the first array, the second edges of the first and second arrays overlying the first conductive area in the first lithographic layer; iii) a third array of electrically conductive elements comprising a plurality of spaced, substantially parallel elements having a length and a width, ends of the individual elements being aligned to form first and second opposing array edges, the individual elements being electrically connected by a central conductive element between the first and second array edges and unconnected across the second array edge, the lengths of and spaces between said elements being sensitive to processing of said layer, one end of the central conductive element being electrically connected to first array edge of the second array of electrically conductive elements, wherein, upon applying a voltage between the first array edge of the first array of electrically conductive elements and the other end of the central conductive element so that current flows through the first array elements, the first conductive area, the second array elements and the central conductive element, the suitability of the second layer may be determined by the resistance as affected by line shortening effects to the lengths of the electrically conductive elements of the first and second arrays and the resistance of the central conductive element as affected by shortening effects to the spaces between the elements.

13. The monitor of claim 12 further including a first pad electrically connected to the first array edge of the first array to apply current through the first array elements and a second pad electrically connected to the other end of the central conductive element to apply current through the central conductive element.

14. The monitor of claim 12 wherein the third array of electrically conductive elements has greater conductivity than the first electrically conductive area of the first lithographically formed layer and wherein the first electrically conductive area underlies the first,, second and third arrays of electrically conductive elements.

15. A method of electrically testing image shortening of a pattern formed on a substrate by lithographic or etch processing comprising:

providing the monitor of claim 1;

applying a voltage to drive a current across the array elements and determining the resistance as affected by line shortening effects to the lengths of the electrically conductive elements of the array; and determining the suitability of the layer by the resistance of the array.

16. The method of claim 15 wherein there is determined the suitability of energy beam dose or focus on a lithographically formed layer.

17. A method of electrically testing image shortening of a pattern formed on a substrate by lithographic or etch processing comprising:

providing the monitor of claim 3;

applying a voltage to drive a current between the first array edge of the array of electrically conductive elements and the second conductive area and determining the resistance of the array as affected by line shortening effects to the lengths of the electrically conductive elements in the array; and determining the suitability of the layer by the resistance of the array.

18. The method of claim 17 wherein there is determined the suitability of energy beam dose or focus on a lithographically formed layer.

19. A method of electrically testing image shortening of a pattern formed on a substrate by lithographic or etch processing comprising:

providing the monitor of claim 6;

applying a voltage to drive a current between first array edges of the first and second arrays of electrically conductive elements and determining the resistance as affected by line shortening effects to the lengths of the first and second arrays; and determining the suitability of the layer by the resistance of the first and second arrays.

20. The method of claim 19 wherein there is determined the suitability of energy beam dose or focus on a lithographically formed layer.

21. A method of electrically testing image shortening of a pattern formed on a substrate by lithographic or etch processing comprising:

providing the monitor of claim 10;

applying a voltage to drive a current between opposing ends of the centrasl conductive element and determining the resistance of the central conductive elements as affected by shortening effects to the space between the elements; and determining the suitability of the layer by the resistance pf the central conductive element.

22. The method of claim 21 wherein there is determined the suitability of energy beam dose or focus on a lithographically formed layer.

23. A method of electrically testing image shortening of a pattern formed on a substrate by lithographic or etch processing comprising:

providing the monitor of claim 12;

applying a voltage to drive a current between the first array edge of the first array of electrically conductive elements and the other end of the central conductive element and determining the resistance as affected by line shortening effects to the lengths of the electrically conductive elements of the first and second arrays and the resistance of the central conductive element as affected by shortening effects to the spaces between the elements; and determining the suitability the layer by the resistance of the first and second arrays and central conductive element.

24. The method of claim 23 wherein there is determined the suitability of energy beam dose or focus on a lithographically formed layer.

* * * * *